United States Patent [19]

Smith

[11] Patent Number: 5,311,131
[45] Date of Patent: May 10, 1994

[54] MAGNETIC RESONANCE IMAGING USING PATTERN RECOGNITION

[75] Inventor: Justin P. Smith, Kirkland, Wash.

[73] Assignee: Board of Regents of the University of Washington, Seattle, Wash.

[21] Appl. No.: 883,565

[22] Filed: May 15, 1992

[51] Int. Cl.$^5$ .............................................. G01V 3/00
[52] U.S. Cl. ..................................... 324/309
[58] Field of Search ............ 324/300, 307, 309, 310, 324/311, 312, 313, 314, 318, 322; 128/653.2

[56] References Cited

U.S. PATENT DOCUMENTS

| | | | |
|---|---|---|---|
| 4,642,778 | 2/1987 | Hieftje et al. | 364/498 |
| 4,734,646 | 3/1988 | Shendy et al. | 324/309 |
| 4,736,751 | 4/1988 | Gevins et al. | 128/732 |
| 5,003,979 | 4/1991 | Merickel et al. | 128/653 |
| 5,218,529 | 6/1993 | Meyer et al. | 364/413.01 |

OTHER PUBLICATIONS

Tien, R. D., "Fat-Suppression MR Imaging in Neuroradiology: Techniques and Clinical Application," American Journal of Roentgenology 158:369-379 (Feb. 1992).
Wang, Y., Veltkamp, D. J., Kowalski, B. R., "Multivariate Instrument Standardization," Analytical Chemistry 63:2750-2756 (Dec. 1991).
Tzalmona, A., Armstrong, R. L., Menzinger, M., Cross, A., Lemaire, C., "Detection of chemical waves by magnetic resonance imaging," Chemical Physics Letters 174:199-202 (Nov. 1990).
Jungke, M., von Seelen, W., Bielke, G., Meindl, S., Krone, G., Grigat M., Higer, P., Pfannenstiel, P., "Information Processing in Nuclear Magnetic Resonance Imaging", Magnetic Resonance Imaging 6:683-693 (May 1988).
Pearce, R. B., "Expert systems enable computers to share in imaging decisions," Diagnostic Imaging pp. 146-152 (May 1987).
Hylton, N. M., Ortendahl, D. D., "Information Processing in Magnetic Resonance Imaging," Critical Reviews in Diagnostic Imaging 26(4):325 (1986).
Nyman, R., Rhen S., Ericson, A., Glimelius, B., Hagberg, H., Hemmingsson, A., Sundstrom, C., "An Attempt to Characterize Malignant Lymphoma in Spleen, Liver and Lymph Nodes with Magnetic Resonance Imaging," Yearbook of Diagnostic Radiology pp. 294-295 (1989).
Geladi, P., Isaksson, H., Lindqvist, L., Wold, S., Esbensen K., "Principal Component Analysis on Multivariate Images."
DeLaPaz, R. L., Bernstein, R., "Computerized Analysis and Information Extraction of Medical Magnetic Resonance Images (MRI)" SPIE 902:151-154 (1988).
Grahn, H., Szeverenyi, N. M., Roggenbuck, M. W., DeLaglio, F., Geladi, P., "Data analysis of Multivariate Magnetic Resonance Images" pp. 1-37.

(List continued on next page.)

Primary Examiner—Michael J. Tokar
Attorney, Agent, or Firm—Townsend and Townsend

[57] ABSTRACT

An MRI technique in which the similarity of samples from different portions of a body is determined and displayed. In one embodiment, the method can be used to track the spread of a known primary tumor to other portions of a patient's body. The MRI apparatus is used to produce a training set comprising one or more training samples. The training set is formed from a plurality of congruent first images of a training region of the body. Each first image is produced using an MRI pulse sequence different from the pulse sequences used to produce the other first images. Each first image comprise an array of pixels, and each training sample comprises a spatially aligned set of pixels from each first image. The same technique is used to produce a plurality of test samples corresponding to a test region of the same body. The test samples are produced using the same pulse sequences as the training samples. The training and test samples are then compared, to produce similarity data indicating, for each test sample, the degree of similarity between the test sample and the training samples. A display is then generated based upon the similarity data.

18 Claims, 8 Drawing Sheets

OTHER PUBLICATIONS

Vannier, M. W., Butterfield, R. L., Rickman, D. L., Jordan, D. M., Murphy, W. A., Biondetti, P. R., "Multispectral Magnetic Resonance Image Analysis," *CRC Critical Reviews in Biomedical Engineering* 15:117–144 (1987).

Grahn, H., Szeverenyi, N. M., Roggenbuck, M. W., Geladi, P., "Tissue Discrimination in Magnetic Resonance Imaging: A Predictive Multivariate Approach," *Chemometrics and Intelligent Laboratory Systems* 7:87–93 (1989).

Sharaf, M. A., Illman, D. L. Kowalski, B. R., "Chemical Analysis: A Series of Monographs on Analytical Chemistry and Its Applications," Wiley-Interscience Publications 82:281–295.

Resonance NewsLetter, No. 25, pp. 1–22, Oct. 1991.

Meeting Abstract, Radiology 1989 173CP:227–228.

Oppelt, A., "Entwicklung und Erprobung von Funktionsmustern fur die Kernspintographie," *Siemens Forschungs Und Entwicklungsberichte,* vol. 15, No. 2, pp. 78–85, 1986.

Hyman, et al., "Characterization of Normal Brain Tissue Using Seven Calculated MRI Parameters and a Statistical Analysis System," *Magnetic Resonance in Medicine,* vol. 11, No. 1, pp. 22–34, Jul., 1989.

Kapouleas, T., "Segmentation and Feature Extraction for Magnetic Resonance Brain Image Analysis," *10th International Conference on Pattern Recognition,* pp. 583–590, Jun. 16, 1990.

Merickel, et al., "Diseased Tissue Identification and Quantification Utilizing MRI," *Proc. of the 12th Annual Int'l Conf. of the IEEE Engineering ini Medicine and Biological Society,* vol. 12, pp. 394–395, Nov., 1990.

Bydder, G. M., "Interpretation and Clinical Application of Magnetic Resonance Imaging," *IEEE Transactions on Magnetics,* vol. 26, No. 5, pp. 2089–2091, Sep., 1990.

Madsen, et al., "Low-Contrast Focal Lesion Detectability Phantom for 1H MR Imaging," *Medical Physics,* vol. 18, No. 3, pp. 549–554, May, 1991.

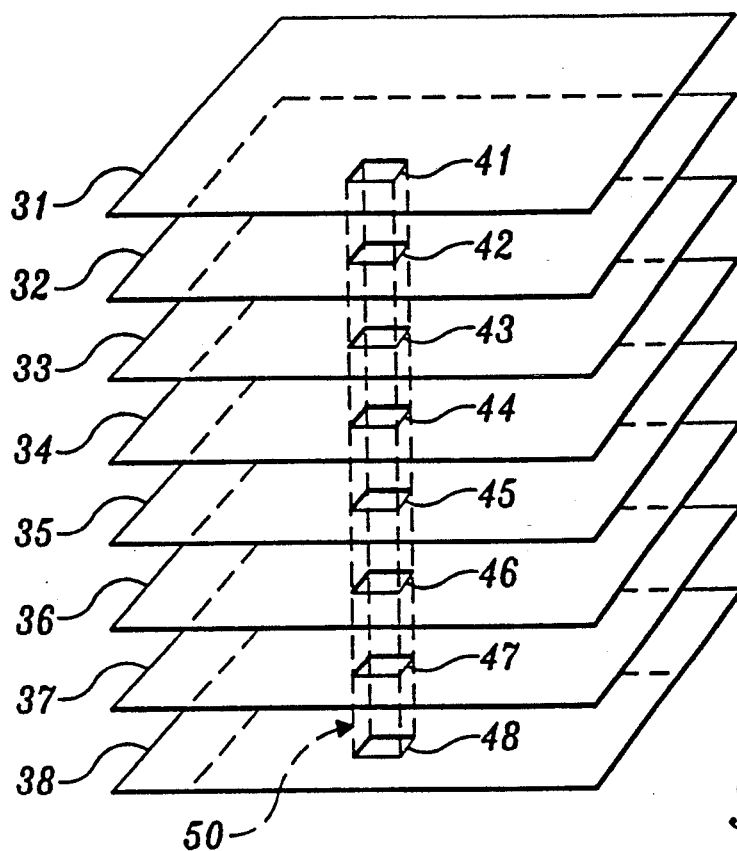

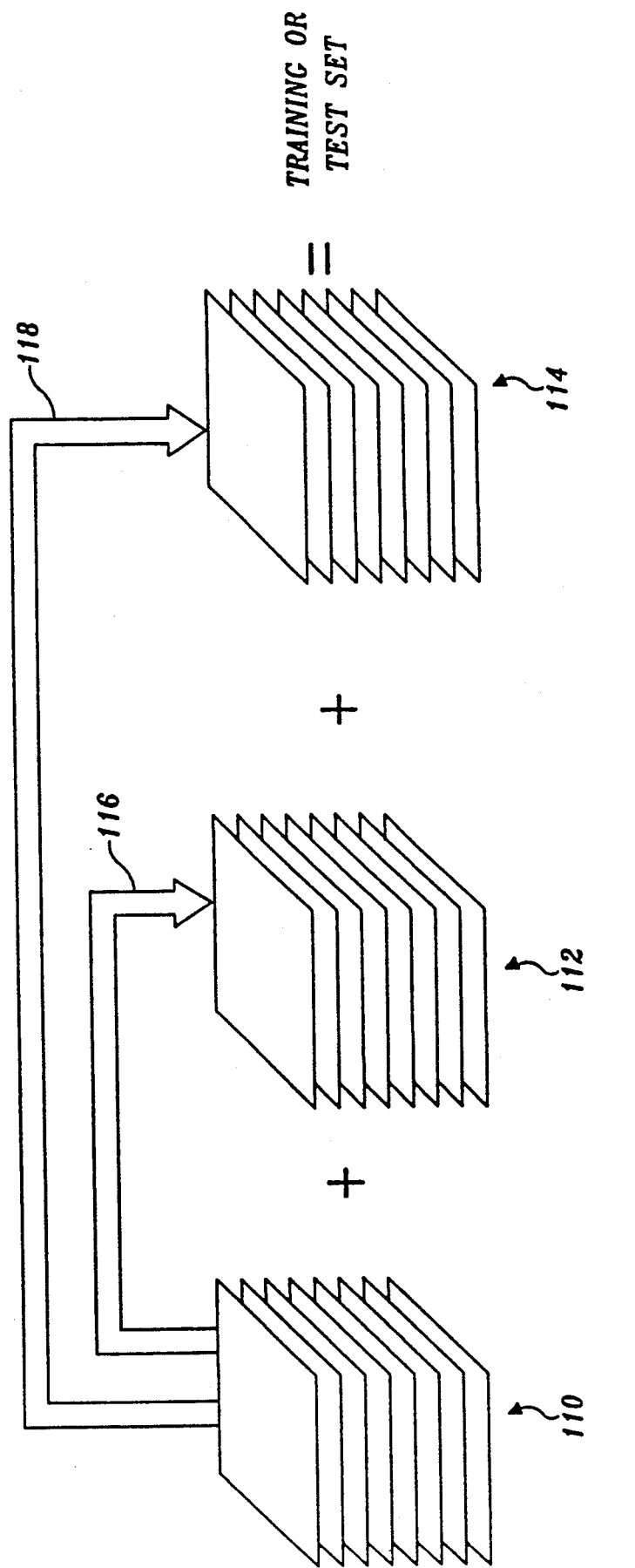

MAGNETIC RESONANCE IMAGING USING PATTERN RECOGNITION

FIELD OF THE INVENTION

The present invention relates to magnetic resonance imaging (MRI), and in particular to the application of pattern recognition methods to MRI.

BACKGROUND OF THE INVENTION

In a typical medical application of MRI, a patient is placed within the bore of a large, donut-shaped magnet. The magnet creates a static magnetic field that extends along the long (head-to-toe) axis of the patient's body. An antenna (e.g., a coil of wire) is also positioned within the bore of the large magnet, and is used to create an oscillating radiofrequency field that selectively excites hydrogen atoms (protons) in the patient's body into oscillation. The oscillating field is then turned off, and the antenna is used as a receiving element, to detect the proton oscillations as a function of position within the body. Typically, the intensity of the oscillations is measured throughout a two-dimensional plane. When the intensities are displayed as a function of position in this plane, the result is an image that often bears a striking resemblance to the actual anatomic features in that plane.

The intensity of proton oscillations detected at a given point in the patient's body is proportional to the proton density at that point. Because different types of tissues have different proton densities, different tissue types usually have different image intensities, and therefore appear as distinct structures in the MR image. However, the signal intensity also depends on physical and chemical properties of the tissues being imaged. In a simplified model of MRI, the detected signal intensity, as a function of position coordinates x and y in the plane being imaged, is proportional to $$(1 - e^{-TR/T_1})e^{-TE/T_2} \quad (1)$$

The parameters TR (recovery time) and TE (echo delay time) are under the control of the operator of the MR imaging system, and are constants for any given image. However, $T_1$ and $T_2$ are functions of the tissue under examination, and therefore vary with position in the x-y plane. By suitable selection of parameters TR and TE, either the $T_1$ or the $T_2$ term in Equation 1 can be made to dominate, thereby producing so-called "$T_1$-weighted" and "$T_2$-weighted" images, respectively.

One of the more important medical uses to which MRI has been put to date is to noninvasively scan a portion of a patient's body, in an attempt to identify benign or malignant tumors. When MRI is used in this fashion, it is necessary to have some methodology for concluding that a given portion of an MR image represents tumor, as opposed to other tissue types such as fat, cyst, etc. One known approach to identifying tissue type has been to acquire multiple MR images of the same region of the patient's body, using different imaging parameters, e.g., using different values of the TR and TE parameters. To take a simplified example, if it were known that a given tumor produced a high image intensity at a first parameter setting, a low image intensity at a second parameter setting, and a high image intensity at a third parameter setting, then a portion of a patient's body that produced that pattern of intensities (high, low, high) could be tentatively identified as tumor.

Pattern recognition approaches of this type are described in U.S. Pat. No. 5,003,979. This patent describes a system for the detection and display of lesions in breast tissue, using MRI techniques. In one described example, three different types of images are obtained for a given region, and the pixels of the image are then classified by comparing their intensity patterns to known patterns for pure tissue types, such as fat, cyst or cancer. The patent indicates that three specific types of images are adequate for statistically separating MR images of breast fat, cyst, carcinoma and fibroadenoma.

Applicants have found that in many cases, comparison of the pattern of intensities of a patient's tissue to "standard" patterns for different tissue types does not produce results of sufficient accuracy. The basic problem appears to be that there is too much variability from one patient to the next, as well as from one MRI machine to the next. For this reason, the use of standard patterns does not result in the high degree of confidence that one must have in order to forego a more certain diagnostic technique, such as biopsy. For this reason, cancer diagnosis based on MRI has not yet achieved widespread acceptance. A problem that occurs frequently in cancer treatment is detecting when a primary tumor has spread to other sites in the patient's body, to produce so-called secondary tumors, known as metastases, at those sites. Detection and correct identification of metastases, using MRI or other imaging techniques, is often complicated by the fact that a remote lesion discovered during staging could represent either a metastasis or a benign incidental finding. A number of benign lesions (such as hepatic hemangiomas and nonfunctioning adrenal adenomas) occur as frequently in patients with a known primary tumor as they do in the general population.

Resolving this dilemma requires additional imaging or biopsy, but often significant uncertainty persists. Biopsy may expose the patient to substantial risk when the lesion is in the brain or mediastinum, or when the patient has impaired hemostasis. Even when biopsy does not present a significant risk to the patient, it may be technically challenging, such as sampling focal lesions in vertebral marrow.

SUMMARY OF THE INVENTION

For the reasons set forth above, it would be useful to have a method that could noninvasively measure the similarity between a known primary tumor and a remote lesion of unknown tissue type. The clinician would use the measured similarity to determine the likelihood that the two lesions represents the same tissue. Such a method could be used to distinguish a pathological fracture from a benign osteoporotic compression fracture in a patient with a known tumor. Similarly, the method could be used to distinguish a metastasis from an infraction in a patient with lung cancer who presents with a supratentorial solitary lesion. Using the computed similarity to determine the likelihood that two lesions represent the same tissue would significantly improve the confidence of noninvasive imaging diagnosis.

Such an approach is provided by the MRI imaging technique of the present invention. In a preferred embodiment, an MRI apparatus is used to produce a training set comprising one or more training samples. The training set is formed from a congruent set of first images of a training region of the body. The training region may be the region of a known primary tumor. The term "congruent" refers to the fact that each of the first images represents the same physical slice or plane through the patient'S body. The first images are produced using a predetermined set of MRI pulse sequences that differ from one another. Each first image comprises an array of pixels, and each training sample comprises a spatially aligned set of pixels from each first image.

The MRI apparatus is also used to produce a test comprising a plurality of test samples. The test set is formed from a congruent set of second images of a test region of the same body. The test region may comprise a region to be scanned for a secondary tumor. The second images are produced using the same MRI pulse sequences as the first images. Each second image comprises an array of pixels, and each test sample comprises a spatially aligned set of pixels from each second image.

For each test sample, one then produces similarity data indicating the degree of similarity between the test sample and the training samples. A display then produced based upon the similarity data. The display identifies the test samples having the highest degree of similarity to the training samples. For example, one of the second images may be displayed using a conventional gray scale, while the most similar pixels are highlighted in color. In the secondary tumor example, the regions of the second image that are highlighted in color will correspond to those regions most similar to the first region (the training set) which comprises the primary tumor. The color highlighted regions will therefore identify possible sites of secondary tumors.

In another aspect, the invention also provides for the generation of spatial correlation images based on each of the first and second images, and the use of the spatial correlation images in combination with the first and second images to produce the training and test samples. Instrument standardization techniques may also be applied, to minimize errors when the first and second images are acquired from different planes through the body, or at different times. In another aspect the present invention may provide a technique for suppressing or enhancing certain tissue types in an MR image.

BRIEF DESCRIPTION OF THE DRAWINGS

FIG. 2 illustrates the concept of a set of congruent images.

FIG. 5 illustrates the concept of first and second nearest neighbor pixels.

FIG. 6 illustrates the combination of spatial correlation images with the original images to form the training or test set.

DETAILED DESCRIPTION OF THE PREFERRED EMBODIMENT

Figure 1:
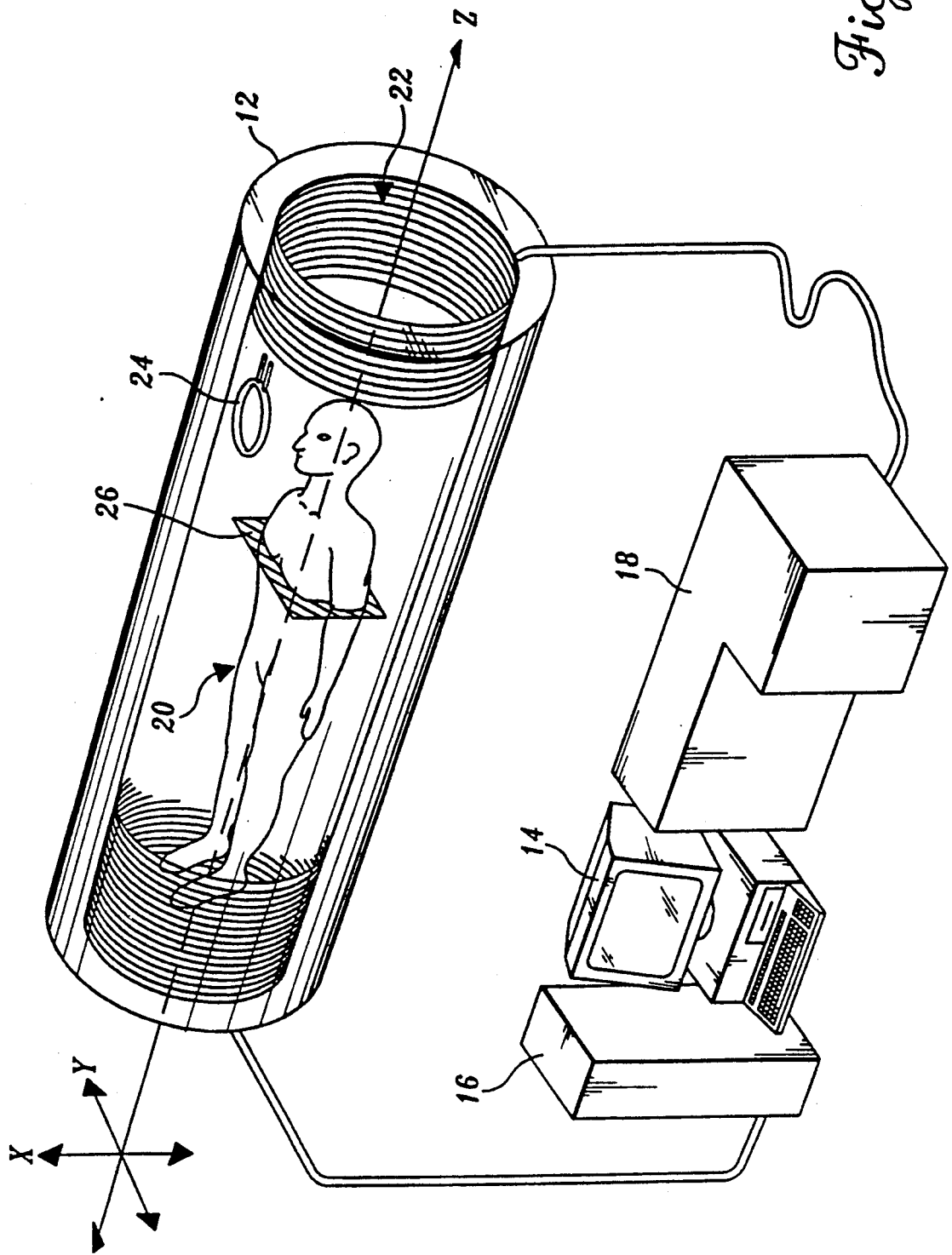
FIG. 1 is a schematic perspective view of an MRI imaging apparatus

FIG. 1 presents a simplified schematic view of a conventional apparatus for performing magnetic resonance imaging. The apparatus comprises housing 12, computer 14 that serves as an operator console, power supply module 16, and signal processing module 18. Housing 12 has the form of a hollow cylinder that surrounds a patient 20 for whom MR imaging is to be performed. The housing includes field coil 22 that is used to create a static magnetic field along the cylindrical axis (z axis) of the housing. The housing also includes antenna 24 that is used both to apply an oscillating radiofrequency field, and then to detect the radiofrequency signals produced by the patient's body in response to the applied static and oscillating fields. The signals detected by the antenna are coupled to signal processing module 18 where they are amplified, condition, and digitized for storage in computer 14. The computer processes the stored data and produces and displays an image of one or more planes or slices 26 through the patient's body.

Unlike computed tomography (CT), magnetic resonance (MR) imaging generates data that are well-suited for quantitative analysis. This is because the MR signal intensity is determined by several variables; hence MR data are said to be multidimensional. It is the multidimensional nature of MR signals that allows them to be analyzed by the group of multivariate statistics known as pattern recognition methods.

Pattern recognition methods have become widely used in science and medicine because they can achieve greater accuracy with lower cost than can traditional methods of data analysis. For example, suppose that we wish to identify an unknown chemical compound by comparison to a library of standard compounds. The traditional approach is to obtain a proton nuclear magnetic resonance (NMR) spectrum of the compound and to compare it to the spectra of the known standards. By using an NMR spectrometer of sufficiently high resolution, even closely-related compounds can often be distinguished from one another. However, the accuracy of even these instruments is limited, and their limited availability make this approach infeasible for many investigators.

An alternative approach is to use pattern recognition methods. Instead of trying to identify a compound by making a single high-resolution measurement, the pattern recognition approach relies on combinations of low-resolution measurements. For example, spectra of the unknown compound would be obtained from low resolution NMR, near-infrared, and mass spectrometers. Multivariate statistics would then be used to compare these three spectra to a library of reference spectra. Combining low resolution measurements made by different modalities usually results in more accurate identification than could be achieved by a high-resolution NMR spectrometer alone.

The ability of pattern recognition methods to recognize similarities between samples is related to the discriminating variance of the data that describe the samples. The greater the discriminating variance of the data, the greater the potential resolution of the pattern recognition method. It is often possible to obtain greater discriminating variance by combining several low-resolution measurements made on different modalities than can be obtained with measurements made on a single high-resolution instrument.

With conventional MR imaging, the user prospectively chooses pulse sequences that are most likely to answer the clinical question. With the present invention, however, the user applies sequences that have been chosen to maximize the information (variance) acquired from a tissue. The user then applies pattern recognition techniques to the data to retrospectively answer the specific clinical question.

The application of pattern recognition techniques to MRI is based on the acquisition of multiple images taken of the same region of a patient's body. The views differ from one another, however, because they are each acquired using different MRI pulse sequences, i.e., using different parameter settings on the MRI apparatus. A set of images acquired in this way are said to be congruent to one another.

FIG. 2 schematically illustrates a set of eight congruent images 31-38. All images are acquired from the same slice or plane through a patient's body, using different parameter settings for each image. Preferably, images 31-38 are all acquired using the same MR instrument, as close in time to one another as practical. Each image comprises a rectangular or square array of pixels, represented by pixel 41 of image 31. By way of example, there may be 256 pixels along one direction (the frequency encoding dimension), and 64-256 pixels along the other direction (the phase encoding dimension), depending upon the particular pulse sequence used. However, other numbers of pixels could also be used. Images 32-38 include pixels 42-48, respectively, that correspond to pixel 41, in that they represent measurements made at the same physical position within the patient's body.

It is important to recognize that the acquired resolution of the array (256×64 for example) usually differs from the displayed resolution of the array (typically 512×512). The acquired array is usually interpolated to 512×512, and the interpolated array is then mildly smoothed (typically using a low-pass filter). Both of these operations are performed by the magnetic resonance imager to improve the subjective appearance of the images. The pixel based operations of the present invention may be performed either on the acquired pixels or on the pixels that have been interpolated and smoothed for display. In general, the latter option will be more convenient, and is therefore preferred.

A collection of pixels from the same relative positions within a set of congruent images, and therefore from the same physical position within a patient's body, are referred to herein as a "sample". There is one such sample associated with each pixel position in the region covered by images 31-38. Sample 50 can be thought of as a very low resolution spectrum that contains information concerning the nature of the patient's tissue at the corresponding pixel position. Sample 50 can also be thought of as a vector in a measurement space having eight dimensions.

As previously described, it is desirable for the data represented by a congruent set of images to have as much discriminating variance as possible. This means that the particular parameter settings used to generate the images need to be selected with care, to maximize the usefulness of the data. For the purpose of discriminating tumor from other tissue types, it has been found that the images are preferably generated using the following standard MR pulse sequences: a $T_1$-weighted spin-echo sequence (one image); a six-echo multiple spin-echo (ME-6) sequence (six images); and a short inversion time inversion recovery (STIR) sequence (one image). Suitable echo times for the ME-6 sequence are 26/52/78/104/130/156 ms, with TR of 1500 ms. For the STIR sequence, suitable parameters are TR 1800-2000 ms, and an inversion time of 110 ms. This particular combination of pulse sequences generates an eight-image data set having a large variance, and is well-suited to the requirements for multivariate analysis.

Many other pulse sequences and combinations of pulse sequences can be used for practicing the present invention. Other suitable combinations include a T1-weighted gradient echo sequence, a fast T2-weighted spin or gradient echo sequence, and a spin or gradient echo sequence adapted for fat suppression. Fat suppression sequences are described in Tien, Robert D, "Fat Suppression MR Imaging in Neuroradiology: Techniques and Clinical Application," *American Journal of Roentgenology* 158:369-379, February 1992, herein incorporated by reference. Magnetization transfer sequences and diffusion sequences may be suitable for certain applications. Contrast materials can also be used to produce a contrast enhanced T1-weighted image. In addition, other spin-echo sequences can be used, with different multiples. For example, a 4-echo multiple spin sequence will produce excellent results in many cases. On some MRI devices, an ME-4 sequence has the advantage that it can automatically acquire multiple stacked slices, in a manner typical of most T1-weighted and STIR sequences. For all sequences used, any parameters available with the sequence can, of course, be adjusted to maximize the usefulness of the invention for particular applications. For example, the inversion time for a STIR sequence can generally be adjusted in the range of 30-160 MS, with the higher inversion times generally being suitable for higher field strength systems. With gradient echo sequences, the RF flip angle can be adjusted to maximize the discriminating variance of the data.

As previously noted, the present invention does not seek to characterize samples based upon their similarity to prior, known patterns for particular types of tissue. Instead, the invention compares samples from a patient to other samples for the same patient. For example, referring to FIG. 3A, a congruent set 60 of images is first obtained for a patient. A first group of one or more samples is then selected as training set 62, while a second group of samples is then selected as test set 64. Training set 62 may lie within a known primary tumor, while test set 64 may be an area to be scanned for the presence of a secondary tumor related to the primary tumor.

Once training set 62 and test set 64 have been selected, one then determines the degree of similarity, or the "distance" between each sample in test set 64 and the training set. Suitable techniques for providing a similarity measurement are discussed below. However, two general approaches are preferred. In the first approach, the distance from the test sample to each training sample is determined, and then the minimum of these distances is selected. In the second approach, an average training sample is computed, and the distance from the test sample to the average training sample is determined.

Once a distance or similarity measure has been determined for each test set sample, one of the images making up test set 64 is displayed, with the "most similar" pixels (e.g., the one percent most similar pixels) highlighted. A preferred highlighting technique is to display the most similar pixels in color, superimposed on a conventional gray scale display of one of the images of the test set. The resulting display has proved to be clinically valuable for permitting a practitioner to identify the extent, if any, to which a primary tumor represented by the training set has spread to regions encompassed by the test set.

Figure 3A:
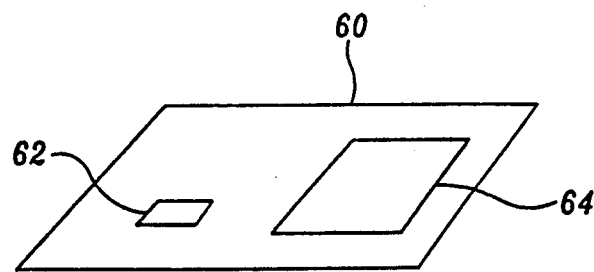
FIGS. 3A–3C illustrate three techniques for forming the training and test sets.
Figure 3B:
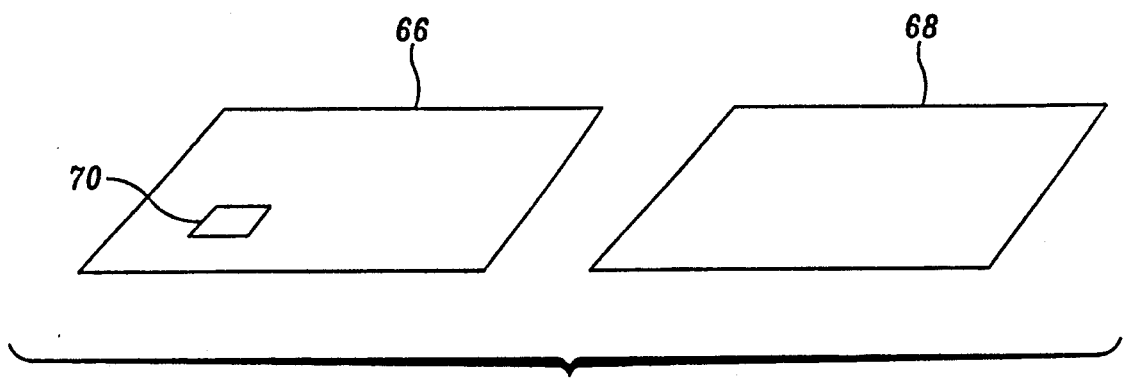
Figure 3C:
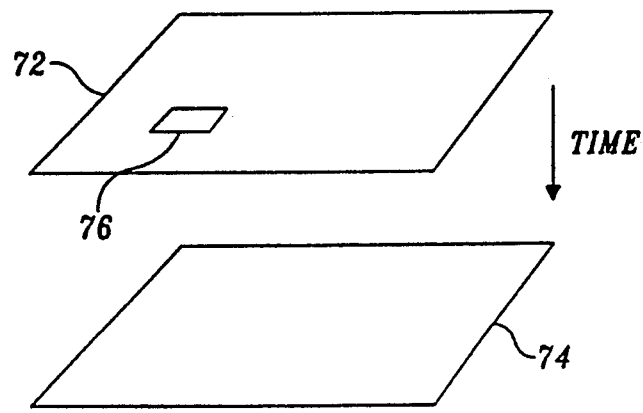

FIGS. 3B and 3C illustrate different techniques for selecting the training and test sets. In FIG. 3B, one obtains two sets 66, 68 of congruent images, for example from two different slices or planes through a patient's body. A training set 70 is selected from set 66, while the entire second set 68 is used as the test set. This variation permits the similarity measurement technique of the present invention to be used to measure the similarity of any two sites within the patient's body, not just two sites within the same image plane.

FIG. 3C illustrates the case in which a first set 72 is acquired at one point in time, and a portion of set 72 is used to form training set 76. At a later point in time, which could be days, weeks or months later, a second congruent set 74 is obtained through the same region of the patient's body, and used to form the test set. In this variation, the present invention can be used to trace the development of a single tumor and assess its response to therapy, as well as to track the spread of the tumor to other sites in the patient's body.

It will be understood that the approaches illustrated in FIGS. 3A-3C are not exhaustive, and that other variations could also be used. For example, the techniques of FIGS. 3B and 3C could be combined, to track the spread of a tumor both in time, and to remote sites in a patient's body.

Figure 4:
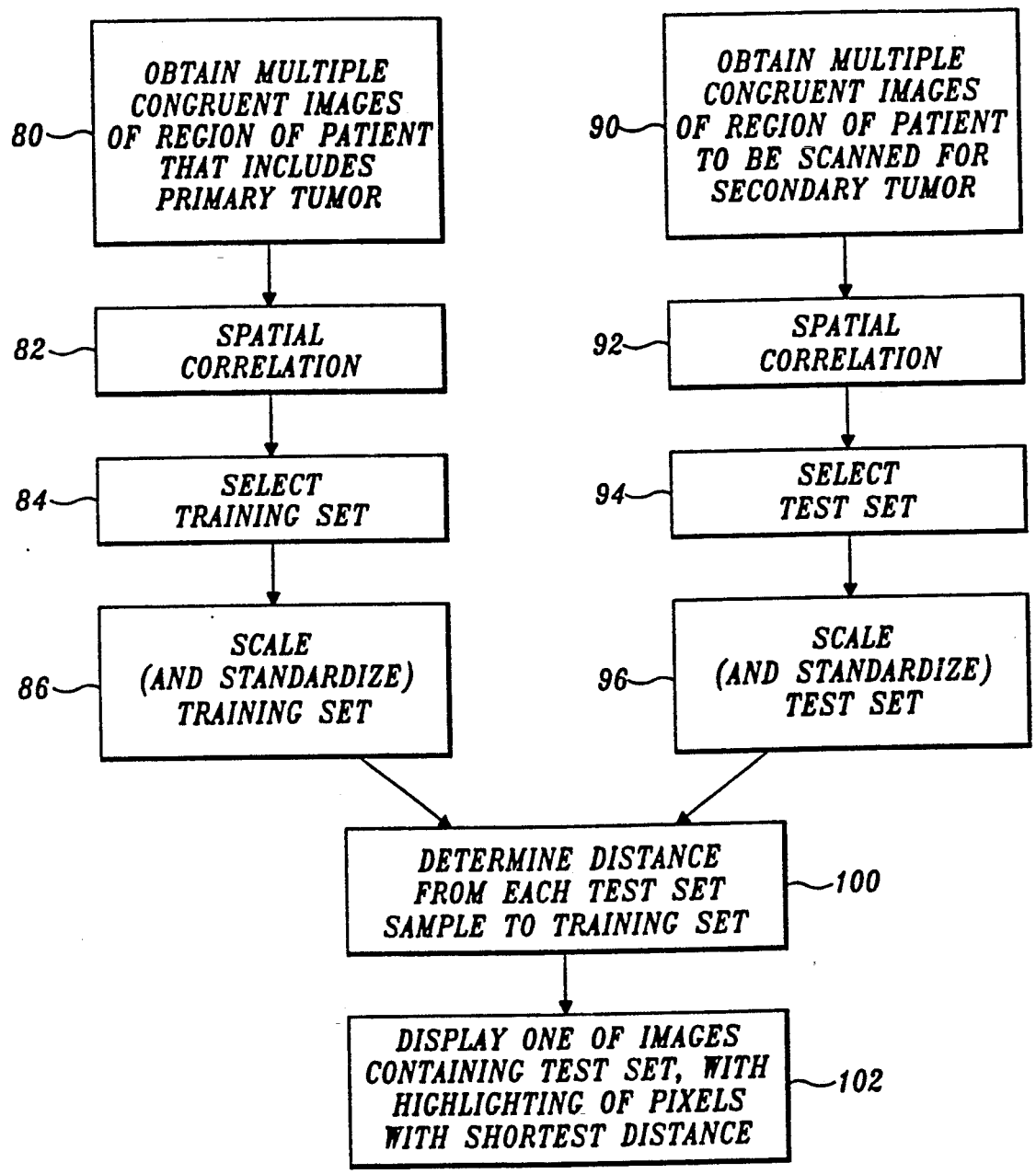
FIG. 4 is a flow chart showing the principle steps of one preferred embodiment of the invention.

FIG. 4 provides a flow chart illustrating the steps used to carry out any of the procedures illustrated in FIGS. 3A-3C, to track the spread of a primary tumor. In step 80, a conventional MR imaging apparatus is used to obtain a first set of multiple congruent images of a region of the patient's body that is believed to contain a primary tumor. In step 82, each of the images in the first set is preferably subjected to a spatial correlation procedure that is outlined in FIGS. 5 and 6.

Referring to FIG. 5, P represents any pixel in any of images in the first set. For pixel P, the eight bordering pixels, labelled 1 in FIG. 5, are referred to as the first nearest neighbor pixels, while the next group of 16 pixels, labelled 2, are referred to as the second nearest neighbor pixels. In spatial correlation step 82 shown in FIG. 4, each of the "original" images in the first set is processed, separately from the other original images, to generate two new images. In the first new image, each pixel has a value equal to the average value of the first nearest neighbor pixels. In the second new image, each pixel has a value equal to the average of the second nearest neighbor pixels. This process is performed for each of the original images in the first set. If there were eight original first set images (as illustrated, for example, in FIG. 2), then this step will produce a total of 24 images as shown in FIG. 6. Stack 110 represents the 8 original first set of images; stack 112 represents the 8 new images generated by first nearest neighbor averaging, while stack 114 represents the eight new images produced by the second nearest neighbor averaging. Thus, as a result of the spatial correlation step, there are now a total of 24 congruent images representing a single slice through the patient. Thus each sample for this slice has a total of 24 intensity values associated with it.

Returning to FIG. 4, the next step 84 is to select the training set, i.e., a subset of samples in this slice that contain the primary tumor under investigation. This step may be carried out by displaying one of the eight original images to the operator on a display screen of computer 14 (FIG. 1), and asking the operator to position a variable-sized box over the image portion to be selected for use as the training set. Once the training set has been selected, the training set samples are scaled in step 86. Scaling is a conventional pattern recognition procedure in which, for example, the data intensity values are linearly adjusted such that they have zero mean value and a standard deviation of unity. The training set may also be standardized in step 86. Standardization is a technique for correcting for the drift of an MRI instrument over time, or for differences between different MRI instruments, and is further described below.

Still referring to FIG. 4, steps 90-96 perform a series of steps analogous to steps 80-86, to create a test set comprising a congruent set of 24 images of the test region of the patient's body to be scanned for secondary tumor. In step 90, a second set of congruent second images of the test region are obtained. The second images are obtained using the same MRI pulse sequences, i.e., the same operator adjustable parameters, as the first images obtained in step 80. In step 92, the second images are each subject to the spatial correlation procedure described above and illustrated in FIGS. 5 and 6. In step 94, the test set is selected. In many cases, the test set will be the complete second images. However, in certain cases, to save processing time, it may be desirable to specify a subregion that includes the actual target of the investigation. Finally, in step 96, the test set is scaled (and standardized) in a manner similar to that performed in step 86.

Once the training and test sets have been prepared, they are then compared to one another in step 100, in order to determine the relative "distance" between the training set and each member of the test set. A number of known statistical techniques are available for computing the distance between pairs of pixels in a multidimensional data space. For the purpose of the present invention, however, the preferred technique has been determined to be a simple Euclidian distance, computed as follows:

$$d = \left[ \sum_{i=1}^{N} (R_i - S_i)^2 \right]^{\frac{1}{2}} \quad (2)$$

$R_i$ represents the ith coordinate of the training sample, $S_i$ represents the ith coordinate of the test sample, and N is the total number of dimensions (e.g. 24) in each data set. Two preferred techniques have previously been described for associating a distance value with each test set sample. In the first technique, an average training set sample is calculated, and the distance between each test set sample and the average training set sample is determined. In the second technique, for each test set sample, the distance from the test set sample to each training set sample is measured, and the minimum of these distances is selected. However, it will be understood that other measures of similarity could also be used without departing from the spirit of the present invention.

The distance measurement of Equation 2 above is an example of the so-called KNN method (K nearest neighbor) for the case of K=1. It is equivalent to the Euclidean distance between samples in a multidimensional measurement space in which each dimension corresponds to one of the images. This embodiment of the KNN technique is an example of supervised classification using a nonparametric classification algorithm. It has been determined that nonparametric techniques are preferable for the purpose of the present invention, as compared to parametric classification approaches, such as Bayesian and SIMCA methods. In parametric methods, there are a priori choices that must be made by the user, leading to the possibility that the classification will reflect observer bias. A potential limitation of nonparametric methods is that they cannot recognize outliers in the data. However, this limitation is overcome in practice, because the human observer will be able to consider the results of classification in the context of the entire image, i.e., the observer serves to recognize outliers.

Computing the Euclidean distance between the average value of the samples in the training set and given sample in the test set is computationally fast, but has the disadvantage of providing little information about the heterogeneity of the training set. Tissue heterogeneity is more accurately expressed by measuring the distance between each sample of the training set and a given sample in the test set, and selecting the smallest distance as the representative distance. The minimum distance measured in this way represents the sample in the training set that is most similar to the sample in the test set.

The accuracy of the pattern recognition technique of the present invention depends on the discriminating variance of the training and test sets; the greater the discriminating variance of the data, the greater the likelihood that two different tissue types will be distinguished. The discriminating variance can be increased by increasing the number of different pulse sequences (images) applied to the region of interest. In theory, the accuracy of classification can be made arbitrarily high by increasing the number of sequences used. In practice, the need for greater accuracy must be balanced by the requirement that the data not be excessively overdetermined, and by practical limits on imaging time. Using excessively overdetermined data reduces the ability of the classification to generalize the properties of the training set to identify similar, but not identical, samples; using undetermined data for classification will lead to a large degree of nonspecific highlighting.

We have found that maximum classification accuracy is reached using relatively low spatial resolution for the ME-6 pulse sequence, which helps decrease the total imaging time. Using this sequence with a 64×256 pixel array (phase, frequency) leads to greater classification accuracy than an array having a higher spatial resolution (128×256), because decreasing the spatial resolution increases the pixel size, which improves the signal-to-noise ratio. This amounts to trading spatial resolution to gain greater spectral resolution, which represents greater information content per pixel. This departs from the traditional approach in MRI, which strives above all else to achieve high spatial resolution.

The degree of tissue discrimination achieved by the invention depends on the percentage of nearest distances that are highlighted. Highlighting a very small percentage (e.g., 0.2% to 2% of the test samples) results in high discrimination, but lowers the sensitivity for detecting unsuspected lesions. Highlighting a larger percentage (2% to 8%) will decrease the degree of tissue discrimination, but will increase the likelihood of detecting unsuspected lesions. If the principle purpose of using MRI is to characterize a recognized lesion of unknown origin rather than to detect unsuspected lesions, then it is generally preferable to highlight only the nearest 0.5% to 2% of the pixels in the test image, to maximize tissue discrimination.

In carrying out the present invention, the data should be adequately overdetermined, such that the ratio of the number of samples to the number of variables describing each sample is at least three. Each sample that represents the combined ME-6, STIR, and T1-weighted sequences consists of 8 original data and 16 derived data that represents spatial correlation variables. A training set that contains 24 or more samples will result in a system that is adequately overdetermined with respect to the original 8 data required for each sample.

Even though it is theoretically important to have the system adequately overdetermined to avoid spurious correlations (i.e., those that arise by chance), we have found that the number of samples included in the training set has surprisingly little effect on the accuracy of classification. Although a training set with 4 samples is relatively undetermined it can result in classification that is similar to the classification achieved by a training set consisting of 25 to 50 samples. At the other extreme, a training set containing 700 samples decreased the amount nonspecific highlighting compared to a 25-sample training set. However, the 700 sample set required about 25 times more computer time than the 25 sample set. In general, we find that a training set size of 16 to 25 samples balances the classification accuracy and computational burden.

The additional imaging time required for the present invention will depend on the radiologist's approach to the oncologic imaging. If radiologists rely on combinations of T1-weighted and T2-weighted images for evaluation of body and CNS metastases, the time required to obtain one or more STIR sequences and multiple spin-echo sequences may be impractical. However, because much body and spinal oncology imaging is accomplished with a combination of STIR and T1-weighted spin-echo sequences, acquiring a multiple-echo spin-echo sequence at two selected anatomic sections adds less than seven minutes to the overall imaging time, when a relatively low spatial resolution is used for the ME-6 pulse sequence.

The accuracy of classification depends on how accurately the training set represents the known tissue. If an area of normal fat adjacent to a known tumor is unintentionally included in the training set, the classified image will highlight both tumor and normal fat. Likewise, if the training set contains only necrotic tumor viable areas of tumor in the test will not be identified. Cluster analysis could be used to detect the inadvertent inclusion of two distinct tissue types within a single training set, which would alert the user to the potential problem.

The most accurate classification occurs when the test and training sets are both acquired in parallel planes; namely, if the training set is acquired in the coronal plane, the test set should be acquired in the coronal plane. The training and test sets should be acquired in parallel planes because the pixels in a given image are not isotropic. When the training and test sets are acquired at different times, as shown in FIG. 3C, then the standardization technique described below should be used, to minimize effects caused by instrumental drift. In all cases, the corresponding sequences used to produce the training and test sets should be acquired using identical instrument parameters: identical phase-encoding direction, slice thickness, field of view, averages, STIR inversion time, and TR. Preferably, the training and test sets should be acquired on the same instrument. However, if they are acquired on different instruments, standardization techniques can be used to minimize the effects of different instruments responses, as described below.

Nonspecific highlighting of pixels in the test set occurs under two circumstances: first, when the discriminating variance of the data is insufficient to enable a classification method to distinguish between tumor and an unrelated tissue; second, when there is a violation of the basic assumption that the MR signatures of tissues depend only on type of tissue and not on the location of the tissue within the imaged plane. Conditions that violate this assumption are: motion artifact along the direction of the phase-encoding gradient; inhomogeneity of the gradients; poorly-shaped radio frequency pulses; and truncation artifact and chemical shift artifact occurring at the boundary between tissues that have substantial difference in their MR signal intensity, such as at the border between solid organs and mesenteric fat.

In evaluating the accuracy of the method, it is important to distinguish between the diagnostic questions which the method has the potential to solve, and those questions that the method is incapable of solving. The invention measures the similarity between different tissues, but generally cannot characterize a tissue as benign or malignant, or as infected or sterile. The user is obligated to apply the invention in a clinically valid way, because the procedure will generate a matrix of distances from any combination of training set and test set. The method is meant to complement, not replace, percutaneous biopsy.

As previously described in connection with FIG. 3C, in one application, the present invention produces the training and test sets from images formed at different times. However, when the training and test set samples are produced at different times, it is possible that drift in the response of the MRI instrument could produce differences between the training and test samples that would influence the results of the present method. In addition, in certain cases, it may be necessary to acquire the training and test samples using different MRI instruments. In this case, differences between the responses of the two instruments could affect the distances between samples in a way not related to the similarity of the underlying tissue.

To eliminate or at least minimize these effects, multivariate instrument standardization techniques are preferably used to limit errors due to instrument variation. Suitable techniques are described in the article by Wang, Veltkamp and Kowalski, "Multivariate Instrument Standardization," *Analytical Chemistry*, 63:2750-56, hereby incorporated by reference. Of the techniques described by Wang et al., the preferred technique is the "direct" technique (including the piecewise direct) in which the samples produced during one imaging session are corrected to produce estimates of the samples that would have been produced during the other imaging session. Because there will typically be more test samples than training samples, it may be preferable in terms of computer time to correct the training samples, which will typically be acquired during the first imaging session, to produce estimates of the target samples that would have been produced at the second imaging session, when the test samples were acquired.

Standardization is performed by including a plurality of calibration standards in the MR imaging apparatus during each imaging session. This can be accomplished by positioning the calibration standard such that some pixels representing each of the calibration standards appear in each image. Alternately, the calibration standards could be separately imaged on a periodic basis (e.g., once a day), and used to standardize all images acquired during that day. For the purpose of the present invention, suitable calibration standards include water, 1 mM (millimolar) $CuSO_4$(aq), 1:1(v:v) acetone:water, safflower oil, mineral oil, saturated sucrose solution, 95% ethyl alcohol, glycerin. However, other calibration standards can also be used. To produce accurate results, the identical calibration standards must be used during acquisition of both the training and test sets, and the calibration standards must not have undergone variation or degradation with time. A suitable number of calibration samples is 8, equal to the number of independently obtained images.

As described above, the results of the method of the present invention may be displayed by displaying one of the original gray scale MR images, and by color highlighting the pixels of that image that correspond to the most similar samples. As long as the training and test sets are obtained from the same set of images, it is accurate to assume that the nearest X % of samples of the test set are truly similar to the training set. However, this assumption is not necessarily true when the training and test sets are obtained from different sets of images. This can be understood by considering classification of a test set that does not contain any of the training tissue, i.e., the tissue in the region spanned by the training samples. Displaying the nearest 1% of distances will highlight 1% of the test set pixels but these distances will be significantly greater than would have been found had the test set contained the training tissue.

To avoid this problem, one can incorporate distance as a threshold in the display process. In this variation, the present invention preferably identifies the X % of the pixels of the test set that have the smallest distance. Of those samples, only those samples that have distances less than Y are displayed, where Y is a selected threshold. This means that if the user chooses to highlight the most similar 2% of the pixels, and those 2% of pixels have distances less than the threshold distance Y (also chosen by the user), then 2% of the pixels will be highlighted. However if some of those 2% have distances greater than the threshold, then only a portion of the 2% will be highlighted. If none of the nearest 2% has a distance less than Y, then no pixels will be highlighted.

The present invention can be applied so as to permit adjustment of an MRI image to selectively enhance or suppress those portions of the image resulting from a given type of tissue. For example, in many clinical applications, a tissue in which one is interested may be surrounded by another tissue such as fat, that has a similar MRI brightness. However if the two tissue types can be distinguished using pattern recognition, then the portion of the images corresponding to fat can be reduced in brightness, improving the resolution of the tissue of interest.

Figure 7:
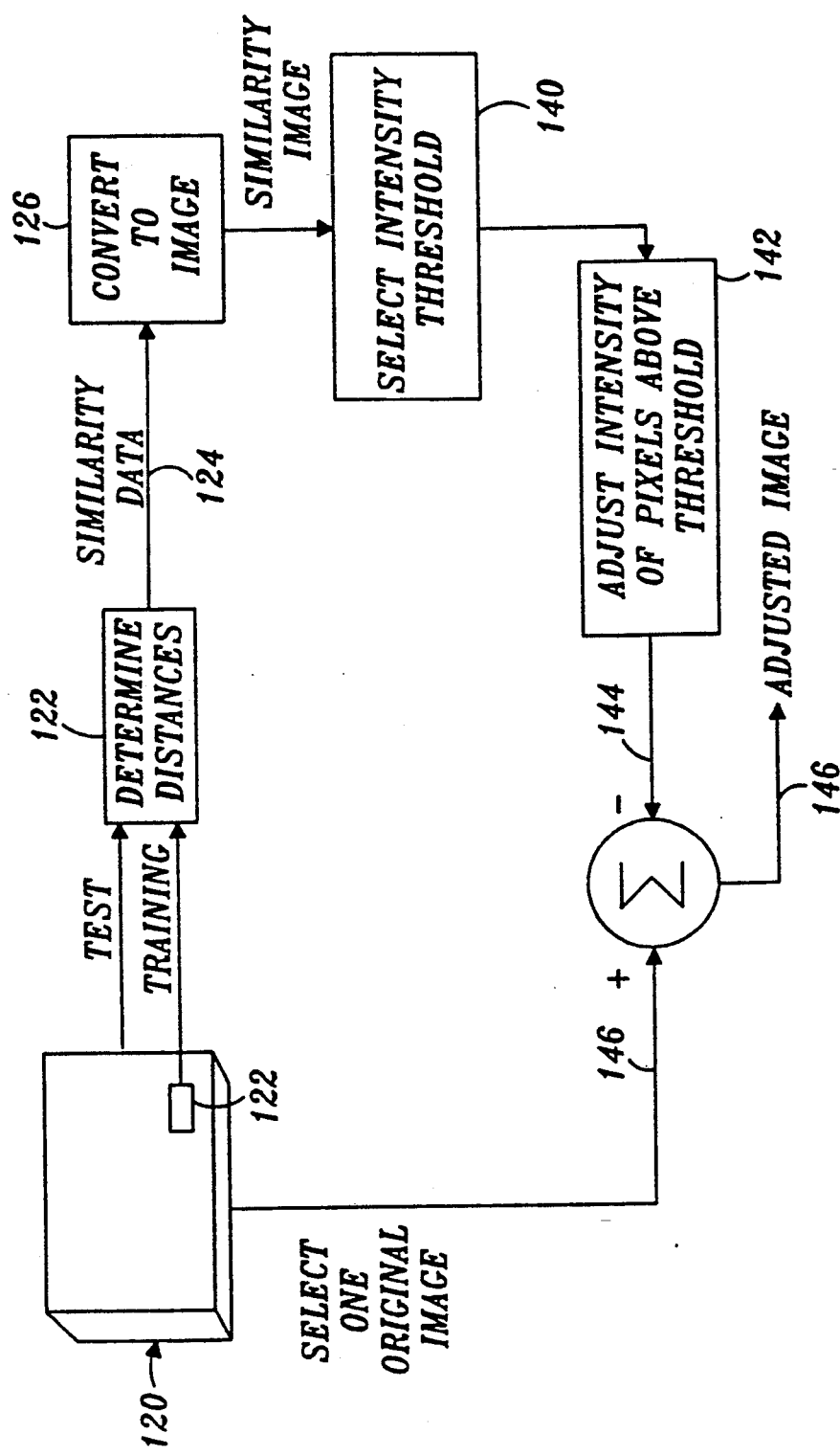
FIG. 7 illustrates the use of the present invention to adjust a portion of an MR image containing a predetermined tissue type.
Figure 8:
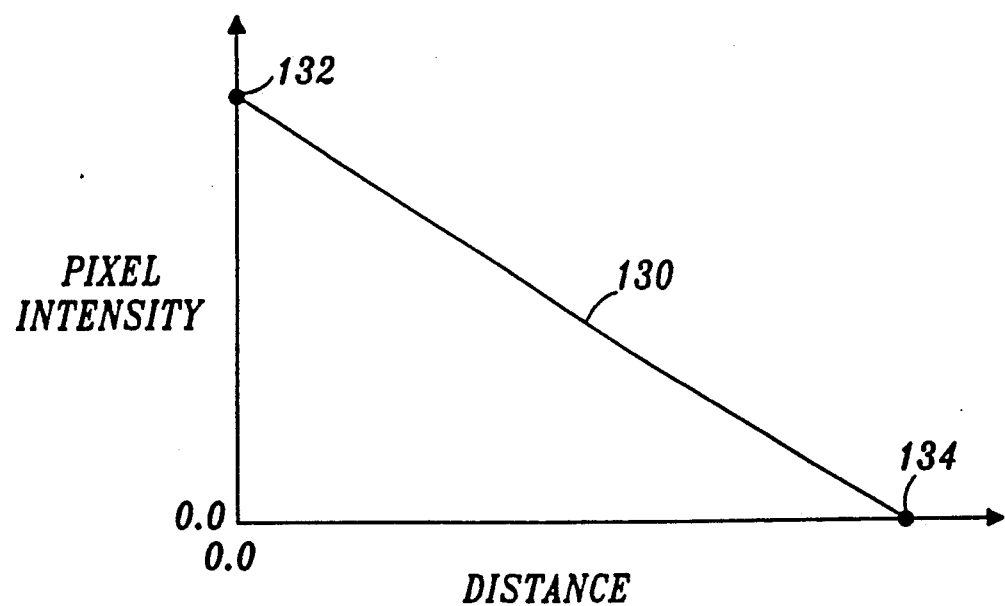
FIG. 8 is a graph showing the conversion of similarity data into an image.

An example of this procedure is illustrated in FIGS. 7-9. The procedure begins, as above, by the generation of a congruent set 120 of images that include a region of interest of a patient. Set 120 preferably includes additional images generated by spatial correlation, as previously described. Set 120 forms the test set, while a small subset 122 is selected to form the training set. The training set is selected such that the training set samples, to the maximum extent possible, correspond only to the tissue type that one wishes to suppress (or enhance).

The test and training set samples are compared in step 122, in the manner described above, to produce similarity data 124 representing the distance between each test set sample and the training set samples. In step 126, the similarity data is converted into a similarity image. The similarity image depicts those portions of the test set region that are similar to the training set. Thus if the training set contains fat tissue, then the similarity image will depict the fat in the test set region. The similarity image may then be displayed, if the goal is to identify other portions of the test region that are similar to the training region. Alternately, the similarity image may be adjusted, as described below, and then subtracted from one of the original images 120, to selectively suppress the fat portions of the original image.

A suitable technique for producing the similarity image is diagrammed in FIG. 8. Similarity data 124 comprises a distance value for each sample of the test set, the distance value being a measure of the distance of the test sample from the training samples in a multidimensional measurement space. Thus the smaller the distance, the greater the similarity. In FIG. 8, line 130 represents the mathematical relationship used to convert a distance value into a pixel intensity for constructing the similarity image. For zero distance, i.e., identical samples, a maximum pixel intensity 132 is selected. As the distance increases from zero, the assigned pixel intensity decreases, until a cut off distance 134 reached. For distances equal to or greater than the cut off distance, the pixel intensity is set to zero. In this manner, a pixel intensity is associated with each sample, producing a similarity image congruent with the original images in set 120.

In step 140, an intensity threshold is chosen to enable the user to limit the subtraction to those pixels of the similarity image that are most similar to the training set. In step 142, the pixels of the similarity image that are greater than the threshold are "scaled", preferably by a user-supplied scaling factor between zero and 1. Thus each pixel intensity in the similarity image that is greater than the threshold is multiplied by the scaling factor. The adjusted similarity image, represented by line 144, is then subtracted from one of the original images, represented by line 144, to produce an adjusted image 148 that is displayed. The overall effect of the process is that for samples having a pattern or signature similar to the pixels in training set 122, the intensity is reduced in the adjusted image. The amount of reduction is controlled by the scaling factor applied in step 142. A similar procedure can be used to produce enhancement of selected tissue types.

Figure 9B:
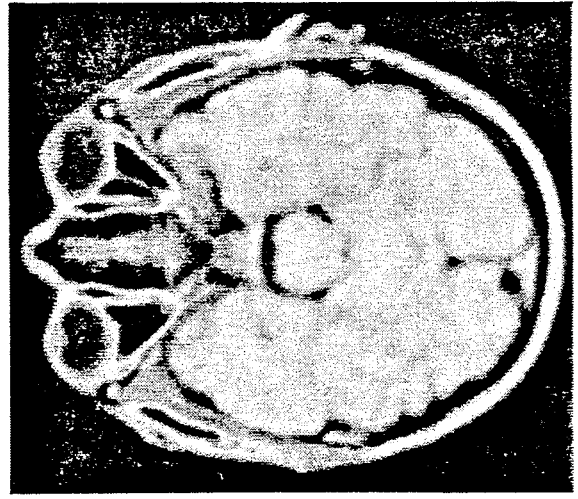
FIGS. 9A and 9B are MR images illustrating fat suppression according to the present invention.
Figure 9A:
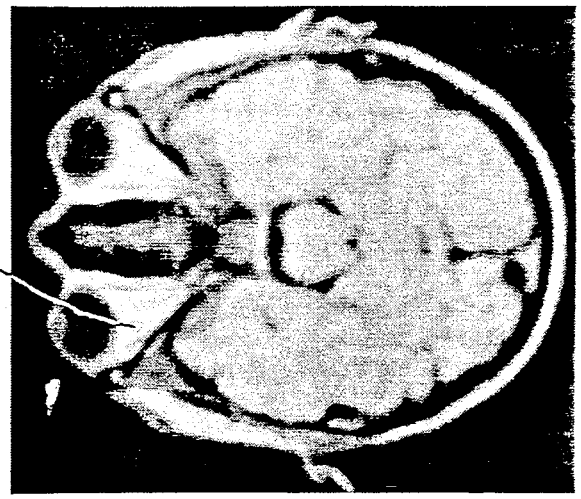

An example of the image adjustment process shown in FIGS. 7 and 8 is illustrated in FIGS. 9A and 9B. FIG. 9A shows a conventional T1-weighted MR image through a patient's head. The region behind each eye contains optic nerves and surrounding fat. The fat tends to obscure the optic nerve and would very likely obscure a contrast-enhanced tumor of the optic nerve because both fat and contrast-enhanced tumor have approximately the same intensity. The congruent images for this application were generated by standard T1-weighted and T2-weighted spin-echo sequences. In this case, training set 150 was selected from a region that included fat but not optic nerves. This training set was used to construct a similarity image which was then subtracted from the original image, producing the adjusted image shown in FIG. 9B. Subtraction of the fat portions of the image enables much clearer resolution of the optic nerves themselves.

While the preferred embodiment of the invention has been illustrated and described, it will be appreciated that various changes can be made therein without departing from the spirit and scope of the invention. For example, the significant cost of an MRI apparatus means that the only practical application for MRI at the present time is for medical applications for humans. However, the principles of the present invention are also applicable to other subjects, such as animals or food products, in which there is a nonhomogeneous body whose MR response varies from one position to another within the body.

The embodiments of the invention in which an exclusive property or privilege is claimed are defined as follows:

1. A method of using magnetic resonance imaging (MRI) to produce an image of a body, the method comprising the steps of:
   using an MRI apparatus to produce a training set comprising one or more training samples, the training set being formed from a plurality of congruent first images of a training region of the body, each first image being produced using an MRI pulse sequence different from the pulse sequences used to produce the other first images, each first image comprising an array of pixels, each training sample comprising a spatially aligned set of pixels from each first image;
   using an MRI apparatus to produce a test set comprising a plurality of test samples, the test set being formed from a plurality of congruent second images of a test region of the same body, the second images being produced using the same MRI pulse sequences as the first images, each second image comprising an array of pixels, each test sample comprising a spatially aligned set of pixels from each second image;
   producing similarty data indicating, for each test sample, the degree of similarity between the test sample and the training samples; and
   producing a display based upon the similarity data.

2. The method of claim 1, wherein the training set comprises a plurality of training samples.

3. The method of claim 2, wherein for each test sample, the similarity data is produced by determining similarity values that represent the similarity between each training sample and the test sample, and then selecting the greatest similarity value.

4. The method of claim 2, wherein for each test sample, the similarity data is produced by determining the similarity of the test sample to an average of the training samples.

5. The method of claim 1, wherein the MRI pulse sequences comprise a T1-weighted pulse sequence, a multiple spin echo pulse sequence, and an STIR pulse sequence.

6. The method of claim 1, wherein the step of producing a display comprises displaying a selected one of the second images, and visually highlighting those portions of the selected second image that correspond to the test samples having the highest degree of similarity.

7. The method of claim 6, wherein that the selected second image is displayed using a grey scale, and wherein the highlighting is performed in color.

8. The method of claim 1, wherein the first and second images are the same as one another, the training and test sets being formed from different portions thereof.

9. The method of claim 1, wherein the first and second images are different from one another, and wherein the training region and test region comprise different portions of the body.

10. The method of claim 9, wherein the first and second images are produced using the same MRI apparatus.

11. The method of claim 1, wherein the first and second images are different from one another, and wherein the training region and test region represent the same region of the body, the first and second images being produced at different times.

12. The method of claim 1, wherein the display identifies the test samples having the highest degree of similarity to the training samples.

13. The method of claim 1, comprising the further steps of converting the similarity data into a similarity image.

14. The method of claim 13, comprising the further step of combining the similarity image with one of the second images to produce the display.

15. The method of claim 14, wherein the similarity image comprises a plurality of pixels, and wherein the combining step comprises adjusting the intensity of the pixels of the similarity image that are above a predetermined threshold to produce a modified similarity image, and subtracting the modified similarity image from the selected second image.

16. The method of claim 1, wherein each pixel comprises a pixel value corresponding to the intensity of a magnetic resonance signal from a corresponding position within the body, wherein the training set includes at least one spatial correlation image corresponding to and congruent with one of the first images, the spatial correlation image comprising an array of spatial correlation pixels, each spatial correlation pixel having a pixel value that is a predetermined function of one or more neighboring pixel values in said corresponding one first image, wherein each training sample comprises a spatially aligned set of pixels from each first image and from each first spatial correlation image, wherein the test set includes at least one second spatial correlation image corresponding to and congruent with one of the second images, the second spatial correlation image comprising an array of second spatial correlation pixels, each second spatial correlation pixel having a pixel value that is a predetermined function of one or more neighboring pixel values in said corresponding second image, each test sample comprising a spatially aligned set of pixels from each second image and from each second spatial correlation image.

17. The method of claim 16, wherein said predetermined function is an average value function.

18. The method of claim 16, wherein two spatial correlation images are generated for each of the first and second images, one in which the spatial correlation pixel values are averages of the first nearest neighbor pixels, and the other in which the spatial correlation pixel values are averages of the second nearest neighbor pixels.

* * * * *